United States Patent
Toyoda et al.

(10) Patent No.: US 8,237,353 B2
(45) Date of Patent: Aug. 7, 2012

(54) ORGANIC EL DISPLAY DEVICE

(75) Inventors: Hironori Toyoda, Mobara (JP); Masahiro Tanaka, Chiba (JP); Masaaki Okunaka, Fujisawa (JP); Masakazu Gunji, Mobara (JP)

(73) Assignees: Hitachi Displays, Ltd., Chiba (JP); Panasonic Liquid Crystal Display Co., Ltd., Hyogo-ken (JP)

(*) Notice: Subject to any disclaimer, the term of this patent is extended or adjusted under 35 U.S.C. 154(b) by 604 days.

(21) Appl. No.: 12/499,839

(22) Filed: Jul. 9, 2009

(65) Prior Publication Data
US 2010/0007272 A1    Jan. 14, 2010

(30) Foreign Application Priority Data
Jul. 9, 2008  (JP) .................................. 2008-179066

(51) Int. Cl.
*H01L 51/52*  (2006.01)
(52) U.S. Cl. ............................ 313/504; 313/506; 445/24
(58) Field of Classification Search .................. 313/504, 313/506; 445/24
See application file for complete search history.

(56) References Cited

U.S. PATENT DOCUMENTS

| | | | |
|---|---|---|---|
| 2002/0135297 A1* | 9/2002 | Maeda | 313/504 |
| 2005/0012454 A1* | 1/2005 | Yamazaki et al. | 313/506 |
| 2005/0017630 A1* | 1/2005 | Ryu et al. | 313/504 |
| 2007/0291574 A1 | 12/2007 | Noda | |

FOREIGN PATENT DOCUMENTS

JP   2007-328141   12/2007

* cited by examiner

*Primary Examiner* — Nimeshkumar Patel
*Assistant Examiner* — Mary Ellen Bowman
(74) *Attorney, Agent, or Firm* — Antonelli, Terry, Stout & Kraus, LLP.

(57) ABSTRACT

In a top emission type organic EL display device, brightness gradient in a screen is reduced while keeping a screen brightness. A reflection film is formed under a lower electrode and the light from an organic EL layer is emitted through an upper electrode. Light absorption of the upper electrode is larger on the side of a shorter wavelength. When a film thickness of the upper electrode is enlarged in order to reduce the brightness gradient in a screen, the film thicknesses of the upper electrodes for a red pixel and a green pixel are enlarged without enlarging the film thickness of the upper electrode for a blue pixel. This makes it possible to reduce the brightness gradient as well as to suppress the light absorption of the upper electrode.

9 Claims, 11 Drawing Sheets

ORGANIC EL DISPLAY DEVICE

CROSS-REFERENCE TO RELATED APPLICATIONS

The present application claims priority from Japanese Application JP 2008-179066 filed on Jul. 9, 2008, the content of which is hereby incorporated by reference into this application.

BACKGROUND OF THE INVENTION

1. Field of the Invention

The present invention relates to an organic EL display device, and more particularly, to a top emission type organic EL display device which has a high and uniform brightness in its screen.

2. Background Art

Organic EL display device is classified into a bottom emission type which takes out light emitted from an organic EL layer in the direction of glass substrate on which the organic EL layer and the like are formed and a top emission type which takes out the light in the direction opposite to the glass substrate on which the organic EL layer and the like are formed. The top emission type has an advantage that the respective organic EL layers can ensure a large area, thus increasing the brightness of a display.

In the organic EL display device, an organic EL layer is sandwiched between a lower electrode and an upper electrode, and light emission from the organic EL layer is controlled by applying a predetermined voltage to the upper electrode and applying a data signal voltage to the lower electrode, thereby forming an image. The data signal voltage is supplied to the lower electrode through a thin film transistor (TFT). In the top emission type organic EL display device, an organic EL layer can be formed on the TFT, thereby enabling a light emission area to increase.

In the organic EL display device, current needs to be supplied from the upper electrode to the organic EL layer. The top emission type organic EL display device has to take out light through the upper electrode, and hence, the upper electrode must be transparent. As a transparent electrode, an ITO (Indium Tin oxide) film, an InZnO (Indium Zinc Oxide) film, a ZnO (zinc oxide) film, and a SnO (tin oxide) film, or the like, is used; however, these metallic oxide conductive films exhibit large resistance. When a film thickness of the upper electrode is increased in order to reduce the resistance in the upper electrode, there arise the following problems.

As one problem, getting the upper electrode thicker causes absorption of light from an organic EL layer, hence to deteriorate brightness. As the other problem, when the upper electrode gets thicker, there is a phenomenon that a specified wavelength light is different to take out owing to the interference of light within the upper electrode.

JP-A-2007-328141 discloses a structure in which light transmittance is enhanced in a liquid crystal display device by varying a film thickness of an opposite electrode formed on an opposite substrate set opposite to the TFT substrate on which TFT and pixels are formed, for every color.

SUMMARY OF THE INVENTION

The technique disclosed in JP-A-2007-328141 is to set a most suitable film thickness of an opposite electrode for every specified wavelength in a liquid crystal display device. In the liquid crystal display device, a liquid crystal layer is sandwiched between a TFT substrate on which TFT and pixel electrodes are formed and an opposite substrate on which color filters are formed. On the opposite substrate, opposite electrodes for applying voltage to liquid crystals are formed opposite to the pixel electrodes. Further, on the opposite substrate, color filters for red, green, and blue are formed for every pixel. The light passing through the respective color filters is different in wavelength and depending on a thickness of the opposite electrode, specified wavelengths interfere with each other, hence to deteriorate the emitting efficiency in some cases. Therefore, in JP-A-2007-328141, an upper electrode is formed through an ink-jet method and a thickness of the opposite electrode is set for every color.

In the liquid crystal display device of a voltage driven type, a voltage drop in the opposite electrode does not matter so much. On the other hand, in the organic EL display device of a current driven type, a voltage drop in the upper electrode becomes a problem. The upper electrodes are formed on the whole substrate, and when a voltage drop occurs in the upper electrodes, brightness changes in some portions on the screen. This phenomenon is referred to as brightness gradient or shading. Therefore, the organic EL display device has to take a resistance of the upper electrode into consideration when setting a film thickness of the upper electrode. When the brightness gradient or shading is reduced to 10% or less in a screen, it comes within allowance.

Further, the upper electrode has to be transparent from the viewpoint of securing a screen brightness. As a transparent electrode, there are an ITO (Indium Tin Oxide) film, an InZnO (Indium Zinc Oxide) film, a ZnO (zinc oxide) film, a SnO (tin oxide) film, and so on, but these metallic oxide conductive films exhibit high resistance. A metal film of low resistance can be used for the upper electrode; however, a metal film has to be extremely thin in order to keep transparency, which does not contribute to reducing a resistance in the upper electrode.

An object of the invention is to realize a top emission type organic EL display device with a high screen brightness while suppressing the shading.

The invention has been made to solve the above problems and the specific means are as follows.

(1) A top emission type organic EL display device with a screen formed by a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, in which, when the total sum of current applied to the red pixels is 50 mA, the total sum of current applied to the green pixels is 50 mA, and the total sum of current applied to the blue pixels is 50 mA, the brightness gradient is 10% or less in the screen, a film thickness of the upper electrode for the red pixel is equal to a film thickness of the upper electrode for the green pixel, and a film thickness of the upper electrode for the blue pixel is smaller than the film thicknesses of the upper electrodes for the red pixel and the green pixel.

(2) The organic EL display device according to (1), in which the film thickness of the upper electrode for the blue pixel is $1/10$ or less of the film thickness of the upper electrode for the red pixel or the green pixel.

(3) A top emission type organic EL display device with a screen formed by a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, in which, when the total sum of current applied to the red pixels is 50 mA; the total sum of current applied to the green pixels is 50 mA; the total sum of current applied to the blue pixels is 50 mA; such a film thickness that brightness gradient is reduced to 10% or less in the screen, with the upper electrodes for the red pixel, the green pixel, and the blue pixel formed in the same film thicknesses, is defined as T; the film thickness of the upper electrode for the blue pixel is defined as TB; the film thickness of the upper electrode for the red pixel is defined as TR; and the film thickness of the upper electrode for the green pixel is defined as TG, TR is equal to TG, and TR and TG are respectively equal to or larger than 3T/2−TB/3.

(4) The organic EL display device according to (3), in which, when the film thickness of the upper electrode for the blue pixel is defined as TB, the film thickness of the upper electrode for the red pixel is defined as TR, and the film thickness of the upper electrode for the green pixel is defined as TG, TR and TG are respectively more than 10 times larger than TB.

(5) A top emission type organic EL display device with a screen formed by a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, in which, when the total sum of current applied to the red pixels is 50 mA; the total sum of current applied to the green pixels is 50 mA; the total sum of current applied to the blue pixels is 50 mA; such a film thickness that brightness gradient is reduced to 10% or less in the screen, with the upper electrodes for the red pixel, the green pixel, and the blue pixel formed in the same film thicknesses, is defined as T; the film thickness of the upper electrode for the blue pixel is defined as TB; the film thickness of the upper electrode for the red pixel is defined as TR; and the film thickness of the upper electrode for the green pixel is defined as TG, the following expressions are satisfied: TB<TG<TR and 3T≦TG+TR+TB.

(6) A top emission type organic EL display device with a screen formed by a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, in which, when the total sum of current applied to the red pixels is 50 mA; the total sum of current applied to the green pixels is 50 mA; the total sum of current applied to the blue pixels is 50 mA; such a film thickness that brightness gradient is reduced to 10% or less in the screen, with the upper electrodes for the red pixel, the green pixel, and the blue pixel formed in the same thicknesses, is defined as T; the film thickness of the upper electrode for the blue pixel is defined as TB; the film thickness of the upper electrode for the red pixel is defined as TR; and the film thickness of the upper electrode for the green pixel is defined as TG, when TB=TG<TR and TB=TG=TT1, 3T−2TT1<TR, and the film thickness in the red pixel becomes such a film thickness that the interference effect of light does not avoid taking out the light.

(7) A top emission type organic EL display device with a screen formed by a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, in which, when the total sum of current applied to the red pixels is 50 mA; the total sum of current applied to the green pixels is 50 mA; the total sum of current applied to the blue pixels is 50 mA; such a film thickness that brightness gradient is reduced to 10% or less in the screen, with the upper electrodes for the red pixel, the green pixel, and the blue pixel formed in the same film thicknesses, is defined as T; the film thickness of the upper electrode for the blue pixel is defined as TB; the film thickness of the upper electrode for the red pixel is defined as TR; and the film thickness of the upper electrode for the green pixel is defined as TG, when TB=TR<TG and TB=TR=TT1, 3T−2TT1≦TG, and the film thickness in the green pixel becomes such a film thickness that the interference effect of the light does not avoid taking out the light.

(8) The organic EL display device according to (1) to (7), in which the upper electrode is formed of oxide containing In, Zn, or Sn as a chief ingredient.

(9) The organic EL display device according to (1) to (7), in which the upper electrode is formed of InZnO.

According to the invention, it is possible to realize an organic EL display device that can suppress the shading phenomenon while keeping a screen brightness by changing a film thickness of the upper electrode for every pixel. Further, according to the invention, it is possible to realize an organic EL display device with a high brightness that can suppress the light absorption of the upper electrode on the whole, by suppressing the film thickness of the upper electrode only for the blue pixel small and enlarging the film thicknesses of the upper electrodes for the red pixel and the green pixel.

DESCRIPTION OF THE PREFERRED EMBODIMENTS

Figure 1:
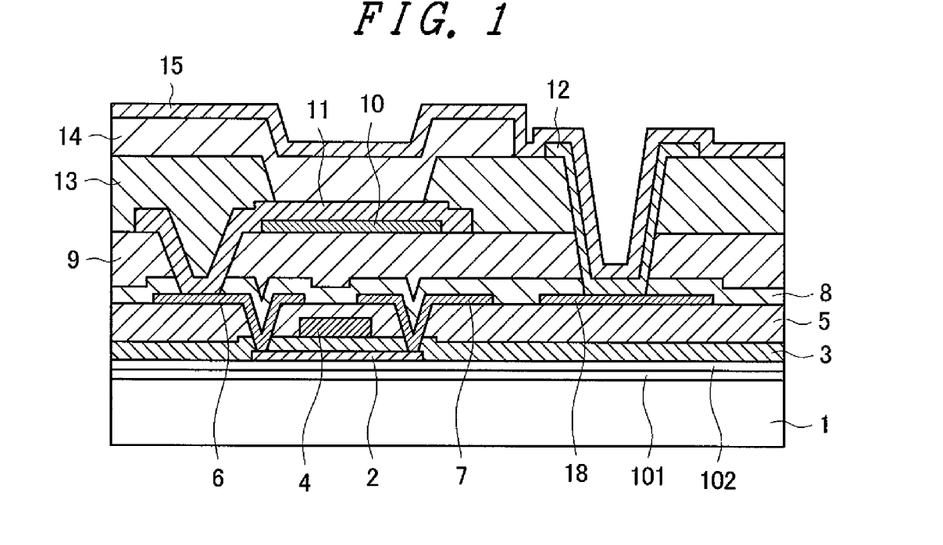
FIG. 1 is a cross sectional view of a top emission type organic EL display device.

Before specifically describing embodiments of the invention, a structure of a top emission type organic EL display device to which the invention is applied will be described. FIG. 1 is a cross sectional view of a top emission type organic EL display device according to the invention. The top emission type organic EL display device is classified into a top anode type in which an anode exists on an organic EL layer 14 and a top cathode type in which a cathode exists on the organic EL layer 14. FIG. 1 shows the case of the top cathode type, and the invention can be applied to the top anode type.

In FIG. 1, a first base film 101 formed of SiN and a second base film 102 formed of $SiO_2$ are formed on a glass substrate 1. This is to avoid a semiconductor layer 2 from being contaminated by the impurities from the glass substrate. The semiconductor layer 2 is formed on the second base film 102 by depositing an a-Si film there through CVD and then converting it into a poly-Si film through laser irradiation.

A gate insulating film 3 formed of $SiO_2$ is formed to cover the semiconductor layer 2. A gate electrode 4 is formed opposite to the semiconductor layer 2 with the gate insulating film 3 intervening therebetween. The gate electrode 4 is formed of the same layer as the gate wiring for supplying a gate voltage to a TFT.

With the gate electrode 4 used as a mask, the impurities such as phosphorus ions or boron ions are injected into the semiconductor layer 2 through ion implantation, to present the conductivity, hence to form a source and a drain in the semiconductor layer 2.

An interlayer insulating film 5 is formed of $SiO_2$ to cover the gate electrode 4, in order to insulate the gate electrode 4, a drain electrode 7, and a source electrode 6. The drain electrode 7 and the source electrode 6 are formed on the interlayer insulating film 5. The drain electrode 7 and the source electrode 6 are formed of the same layer. The drain electrode 7 is formed of the same layer as an image signal line for supplying an image signal to a pixel and a power source line 18 for supplying electric current to an organic EL element.

The drain electrode 7 is connected to the drain of the semiconductor layer 2 via a through hole which is formed in the interlayer insulating film 5 and the gate insulating film 3. The source electrode 6 is connected to the source of the semiconductor layer 2 via a through hole which is formed in the interlayer insulating film 5 and the gate insulating film 3.

Then, an inorganic passivation film 8 formed of SiN is deposited there in order to protect the TFT. An organic passivation film 9 is formed on the inorganic passivation film 8. Together with the inorganic passivation film 8, the organic passivation film 9 has a function of protecting the TFT more perfectly as well as a function of flattening the surface on which the organic EL layer 14 is formed. Therefore, the organic passivation film 9 is formed thick with a thickness of 1 to 4 μm.

A reflection film 10 is formed on the organic passivation film 9 using Al or Al alloy. Having a high reflectance, Al and Al alloy are suitable for the reflection film 10. An ITO film that becomes a lower electrode 11 of the organic EL layer 14 is deposited on the reflection film 10. Resistivity of the ITO forming the lower electrode 11 can be remarkably reduced by annealing at a temperature of about 200° C.

The lower electrode 11 is connected to the source electrode 6 of the TFT via a through hole formed in the organic passivation film 9 and the inorganic passivation film 8. Since this embodiment adopts a top cathode type, the ITO that is the lower electrode 11 is an anode.

The organic EL layer 14 is formed on the lower electrode 11. The organic EL layer 14 includes five layers: a hole injection layer, a hole transport layer, a light emitting layer, an electron transport layer, and an electron injection layer sequentially from the bottom. The organic EL layer 14 is formed through a mask deposition for every light emitting color.

An upper electrode 15 that is a cathode is formed on the organic EL layer 14. In the embodiment, InZnO is used as the upper electrode 15. Without using a mask, InZnO is deposited on the whole display region. The InZiO film is formed in a thickness of about 30 nm in order to keep the transmittance of light. In the invention, however, a film thickness of the upper electrode is changed for a red pixel 17R, a green pixel 17G, and a blue pigment 17B, as described later.

Resistivity of the ITO can be decreased when ITO is annealed at a temperature of about 200° C.; the organic EL layer 14, however, is broken at a temperature of about 200° C. after the organic EL layer 14 is formed. Then, InZnO that requires no annealing is used for the upper electrode 15. When InZnO is not annealed, it has a lower resistance than ITO.

A bank 13 is formed between pixels in order to avoid the organic EL layer 14 from collapsing at the end portion near separation. The bank 13 may be formed of an organic material or it may be formed of an inorganic material such as SiN. In the case of using the organic material, it is formed of acrylic resin or polyimide resin in general. This embodiment adopts an acrylic resin for the bank 13.

In another part than the TFT, a power source line 18 for supplying electric current to the organic EL layer 14 is formed using the same layer as the drain electrode 7 and the source electrode 6. A through hole is formed in the inorganic passivation film 8 and the organic passivation film 9 that are formed on the power source line 18, hence to connect the upper electrode 15 to the power source line 18. Simultaneously with the lower electrode 11, a connection electrode 12 is formed inside the through hole using ITO. The upper electrode 15 is deposited on the inside of the through hole, overlapping the connection electrode 12. In this way, the contact in the through hole has a double layered structure, thereby ensuring the conductivity in the through hole.

Figure 2:
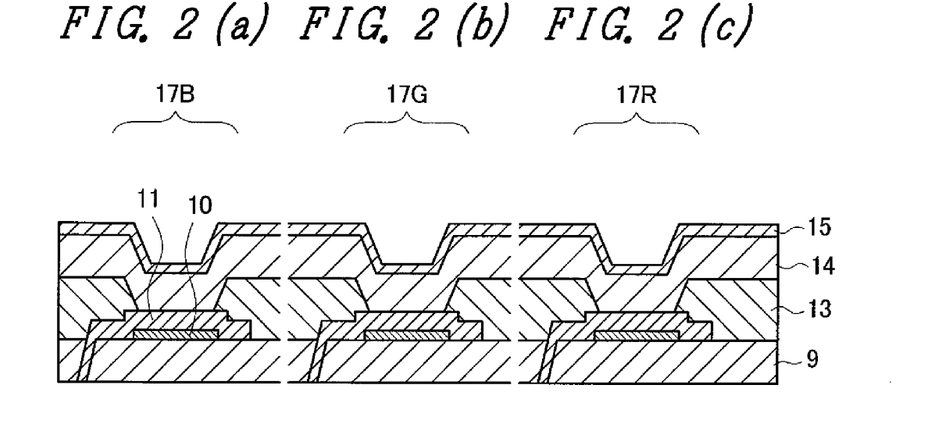
FIG. 2A, FIG. 2B, and FIG. 2C are cross sectional views each showing the periphery of an upper electrode in the top emission type organic EL display device.

FIG. 2A, FIG. 2B, and FIG. 2C are cross sectional views each showing a pixel portion only taken away from the top emission type organic EL display device in FIG. 1. FIG. 2A is a cross sectional view of a blue pixel 17B, FIG. 2B is a cross sectional view of a green pixel 17G, and FIG. 2C is a cross sectional view of a red pixel 17R. FIG. 2A, FIG. 2B, and FIG. 2C have the same layer structure; however, the materials of the respective light emitting layers in the organic EL layer 14 are various.

The material of the light emitting layer is not restrictive but a host material having an electron and hole transport function may be doped with a dopant which becomes fluorescent or phosphorescent owing to their recombination, thus forming a light emitting layer in the co-deposition structure. For example, the host may be complex such as tris(8-quinolinolato)aluminum, bis(8-quinolinolato)magnesium, bis (benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato lithium, tris(5-chloro-8-quinolinolato)gallium, bis(5-chloro-8-quinolinolato) calcium, 5,7-dichlor-8-quinolinolato aluminum, tris (5,7-dibromo-8-hydroxyquinolinolato)aluminum, and poly [zinc(II)-bis(8-hydroxy-5-quinolinyl)methane], an anthracene derivative, a carbazole derivative, or the like.

Further, a dopant is to capture electrons and holes within the host to recombine them and emit light; for example, it may be a fluorescent material, such as a pyran derivative in red, a coumarin derivative in green, and an anthracene derivative in blue, or a phosphorescent material, such as iridium complex, pyridinato derivative, and the like.

An upper electrode 15 is formed on the organic EL layer 14. The upper electrode 15 is formed of InZnO. The upper electrode 15 is deposited after the organic EL layer 14 is formed and it cannot be annealed at a high temperature, and therefore, InZnO is used which has a lower resistance than ITO when it is not annealed. The upper electrode 15 is formed thin in order to avoid light absorption to the best degree possible. Owing to this, however, a voltage drop occurs in the upper electrode 15 and there arises a problem of shading or brightness gradient.

Figure 7:
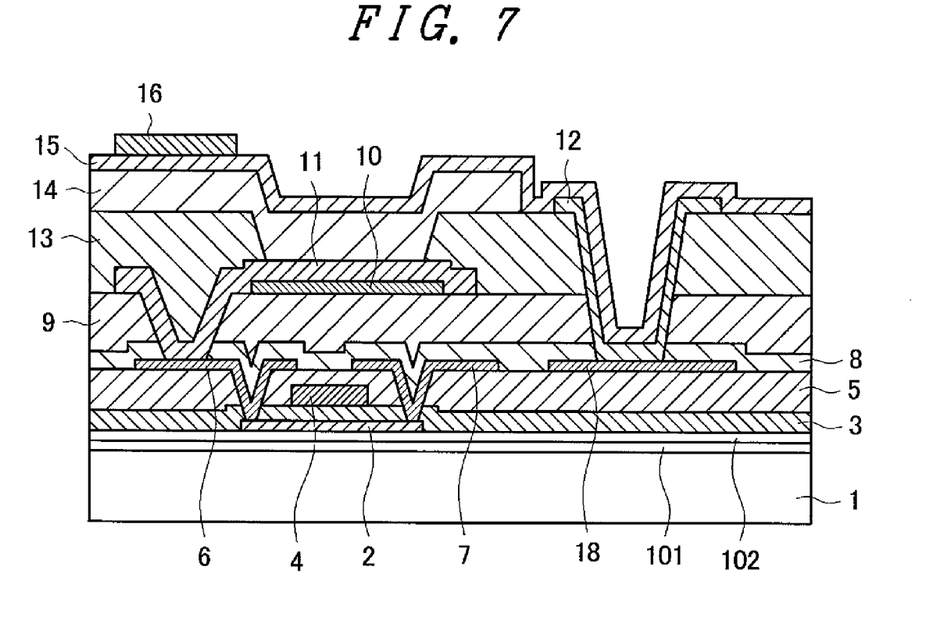
FIG. 7 is a cross sectional view of a conventional example using an auxiliary electrode.

In order to reduce a voltage drop in the upper electrode 15, an auxiliary electrode 16 may be formed on the bank 13 which doesn't form an image. FIG. 7 is a cross sectional view showing an example of forming the auxiliary electrode 16 on the bank 13. As the auxiliary electrode 16 is provided to reduce the resistance, it is formed by a comparatively thick metal having a low resistance. Therefore, it is not transparent optically.

Figure 8:
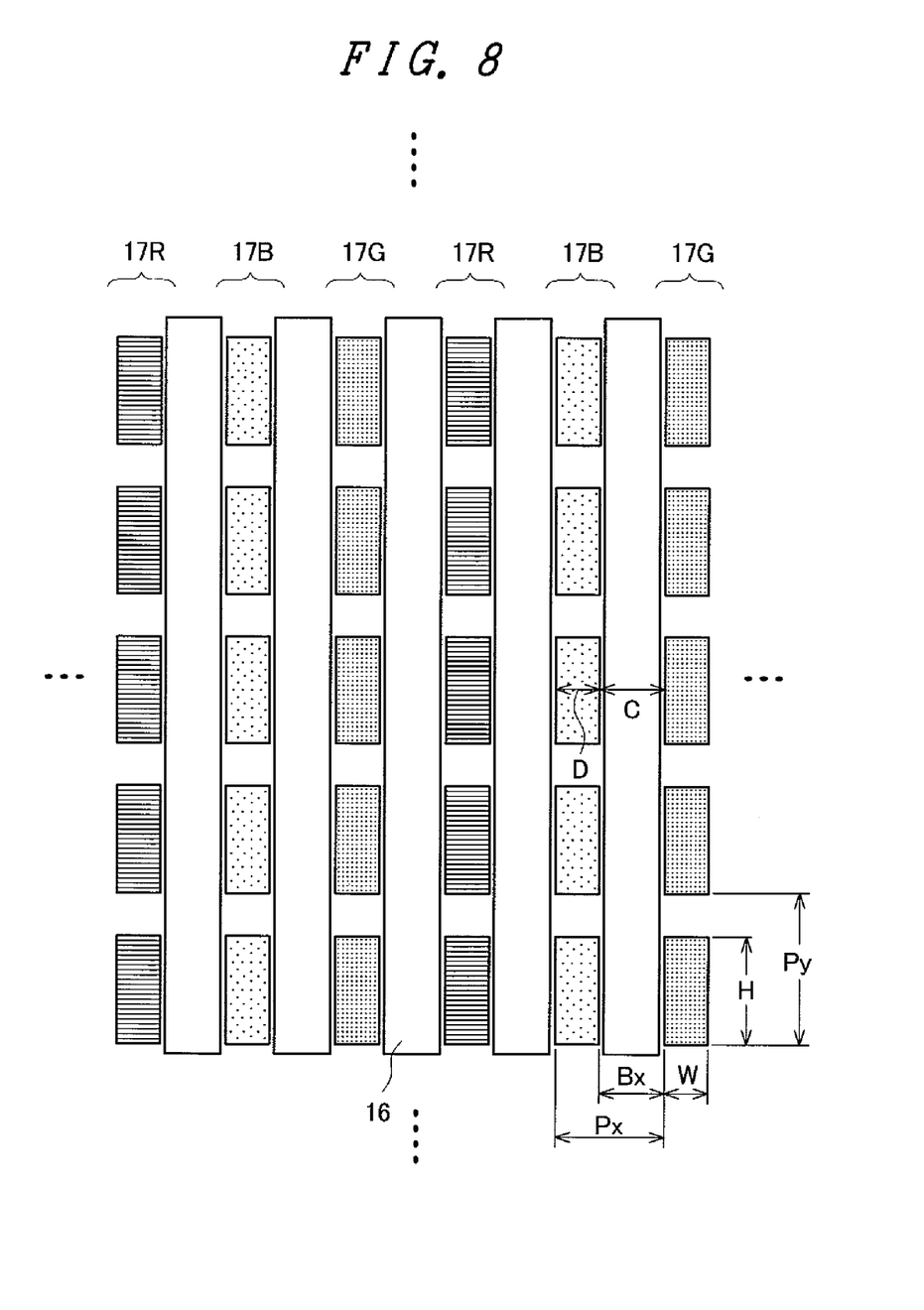
FIG. 8 is a plan view of the conventional example using the auxiliary electrode.

FIG. 8 is an example of forming the respective auxiliary electrodes 16 between the respective pixels in a stripe shape. When a pixel pitch is large, the width of the bank 13 forming the auxiliary electrode 16 can be widened; in a high definition screen, however, when a pixel pitch gets smaller, it becomes difficult to form the auxiliary electrodes 16.

When a screen becomes high definition, a pitch Px of a pixel in the horizontal direction is 42 µm, the vertical pitch Py of a pixel is 94.5 µm, the horizontal diameter W of a pixel is 24 µm, and the vertical diameter H of a pixel is 60 µm, for example, in FIG. 8. In this case, the width Bx of the bank 13 in the horizontal direction is 18 µm. Therefore, the auxiliary electrode 16 must be formed within the width of 18 µm. The auxiliary electrode 16 is formed through deposition and it is not easy to form such a thin film at a correct position with a deposition mask. As the auxiliary electrode 16 is formed thicker and opaque, the positioning accuracy of the deposition is not enough and the efficiency of taking out light from a pixel is affected directly when the auxiliary electrode 16 is formed in the pixel region. Especially, in a high definition screen, it is difficult to suppress the shading by the auxiliary electrode 16.

Figure 9:
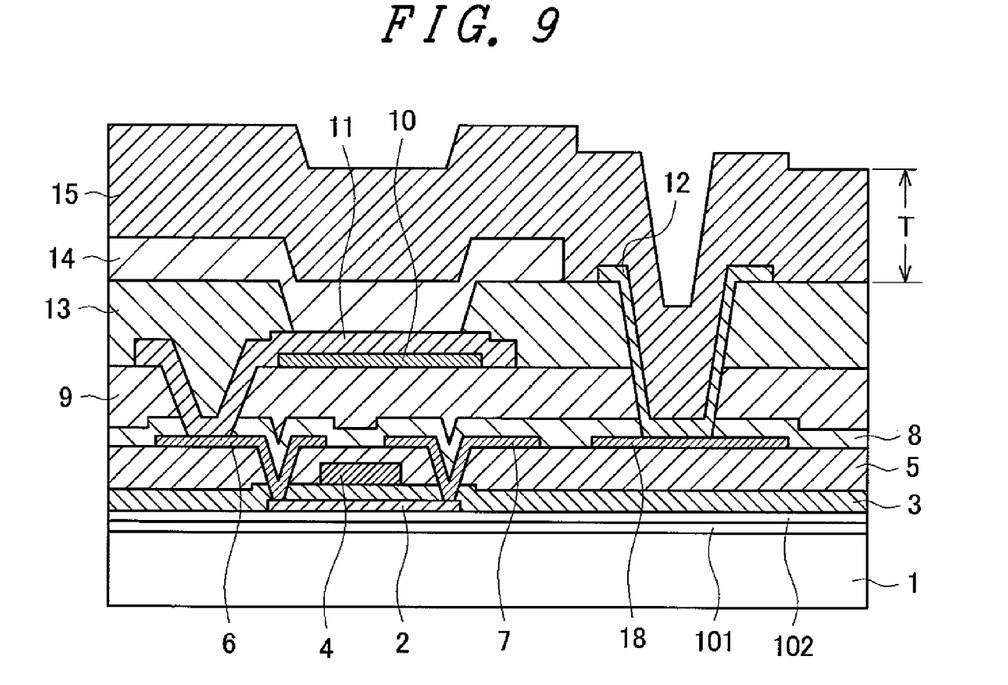
FIG. 9 is a cross sectional view in the case where the upper electrodes of all pixels are thickened.

While, as illustrated in FIG. 9, when the upper electrode 15 gets thick, a voltage drop can be suppressed in the upper electrode 15, but in this case, light absorption in the upper electrode 15 is large, hence to deteriorate a screen brightness. The film thickness T in FIG. 9 is a film thickness that the shading can be reduced to 10% or less in a screen. The embodiments which will be described hereinafter are to solve these problems.

Embodiment 1

FIG. 3A, FIG. 3B, and FIG. 3C are cross sectional schematic views showing the first embodiment of the invention. FIG. 3A is a cross sectional view of a blue pixel 17B, FIG. 3B is a cross sectional view of a green pixel 17G, and FIG. 3C is a cross sectional view of a red pixel 17R. This embodiment is characterized in that the respective upper electrodes 15 for the red pixel 17R and the green pixel 17G are thicker than the upper electrode 15 for the blue pixel 17B.

Figure 4:
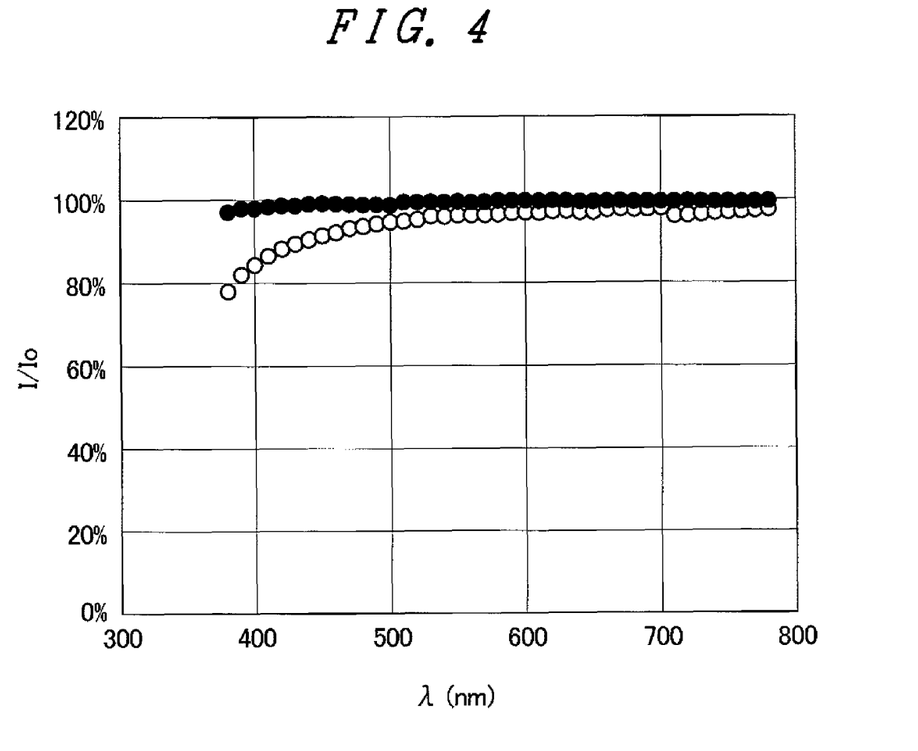
FIG. 4 shows transmittance with respect to light wavelength in the upper electrode.

Light absorption of InZnO used as the upper electrode 15 is greater according as the wavelength of light is shorter. FIG. 4 shows a light transmittance of InZnO in every wavelength; the horizontal axis indicates a light wavelength λ (nm), while the vertical axis indicates a light transmittance I/Io. The transmittance in the case where a film thickness is a specified value B, is shown by a black circle and the transmittance in the case where a film thickness becomes ten times as large as the specified value B, is shown by a white circle. In FIG. 4, when a film is comparatively thin, light absorption is smaller and light absorption wavelength dependency is smaller. On the other hand, when a film thickness gets larger, the light absorption becomes larger especially when the wavelength gets shorter. FIG. 4 shows the properties toward InZnO, but the properties have the same trend as those of the other transparent electrode formed of ITO, ZnO, or the like.

Using the absorption property of the upper electrode 15, the invention is constituted in that the respective film thicknesses of the respective upper electrodes 17 for the green pixel 17G and the red pixel 17R, in which transmittance is not so much deteriorated even when the film thickness of the upper electrode 15 gets larger, are formed thicker and that the film thickness of the upper electrode 15 for the blue pixel 17B, in which transmittance is much affected by the film thickness, is not formed thick. This can avoid the shading while suppressing the deterioration in brightness.

Shading depends on the current applied to the upper electrode 15. Namely, according as the current is more, a voltage drop is larger and the shading becomes more significant. Therefore, it is necessary to estimate the shading with the current applied to each pixel determined. Generally, shading is estimated by checking whether it can suppress the shading at 10% or less in a screen when the current of 50 mA in total is applied to all the red pixels 17R, the current of 50 mA in total is applied to all the green pixels 17G, and the current of 50 mA in total is applied to all the blue pixels 17B. When the above current is applied to the red pixels 17R, the green pixels 17G, and the blue pixels 17B, the screen brightness becomes about 250 cd/m$^2$.

An actual film thickness can be determined as follows. Assume that such a film thickness that the shading can be reduced to 10% or less is defined as T when the upper electrodes of all the pixels get thick, as illustrated in FIG. 9. In the structure of FIG. 9, however, the transmittance in the blue pixel 17B gets smaller. According to the invention, the film thickness of the upper electrode 15 for the blue pixel 17B is not enlarged, while the upper electrodes 15 for the red pixel 17R and the green pixel 17G are thickened, thus compensating the shortage for the upper electrode 15 in the blue pixel 17B.

Figure 3:
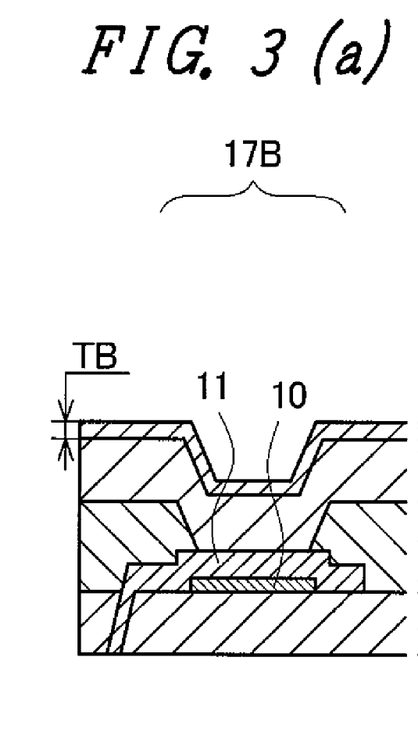
FIG. 3A, FIG. 3B, and FIG. 3C are cross sectional views each showing the periphery of the upper electrode according to a first embodiment.

Namely, as the upper electrodes 15 are continuous, it may be considered that a voltage drop is determined by the average film thickness of the blue pixels 17B, the green pixels 17G, and the red pixels 17R. The respective thicknesses of the upper electrodes 15 for the red pixel 17R and the green pixel 17G are larger than T. In FIG. 3, when the film thickness of the upper electrode 15 for the blue pixel 17B is defined as TB and the film thickness of the upper electrode 15 for the red pixel 17R or the green pixel 17G is defined as TT, it satisfies the following relation: $3T/2-TB/2 \leq TT$. In this expression, T is a film thickness in the case of making the shading at 10% or less in a screen by thickening the upper electrodes 15 of all the pixels.

Figure 5:
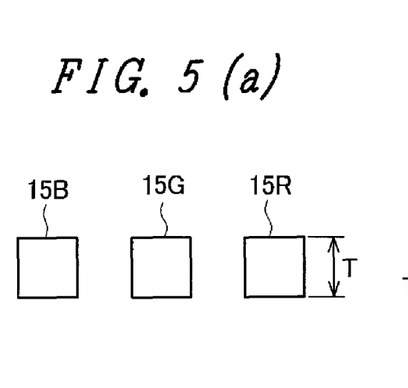
FIG. 5A and FIG. 5B are views for use in describing the setting of a film thickness of the upper electrode according to the first embodiment.

The above expression can be derived from the concept as shown in FIG. 5A and FIG. 5B. In FIG. 5A and FIG. 5B, the reference symbols 15B, 15G, and 15R indicate the upper electrodes 15 for the blue pixel 17B, the green pixel 17G, and the red pixel 17R respectively. In FIG. 5A, the film thickness T is a film thickness in the case of making the shading at 10% or less in a screen by thickening the upper electrodes 15 of all the pixels. In FIG. 5B, the reference symbol TB indicates a film thickness of the upper electrode 15 for the blue pixel 17B when the film thickness is not enlarged, the reference symbol TT indicates each film thickness of the upper electrodes 15 for the red pixel 17R and the green pixel 17G. In FIG. 5A and FIG. 5B, it satisfies the relation of $3T \leq 2TT+TB$. Namely, the whole volume of all the upper electrodes 15 when only the upper electrode 15 for the blue pixel 17B is not thickened, is made equal to or larger than the whole volume of all the upper electrodes 15 when the upper electrodes 15 get thick uniformly in all the pixels. According to this, a voltage drop in the upper electrodes 15 in the case of FIG. 5B can be set equal to or less than a voltage drop in the upper electrodes 15 in the case of FIG. 5A.

In FIG. 5A and FIG. 5B, for example, when T in FIG. 5A is 300 nm and TB in FIG. 5B is 30 nm, TT is 435 nm or more. According to the detailed estimation, when T is set so that the shading becomes 10% or less in a screen, TT in FIG. 5B is more than ten times the value of TB.

Figure 6:
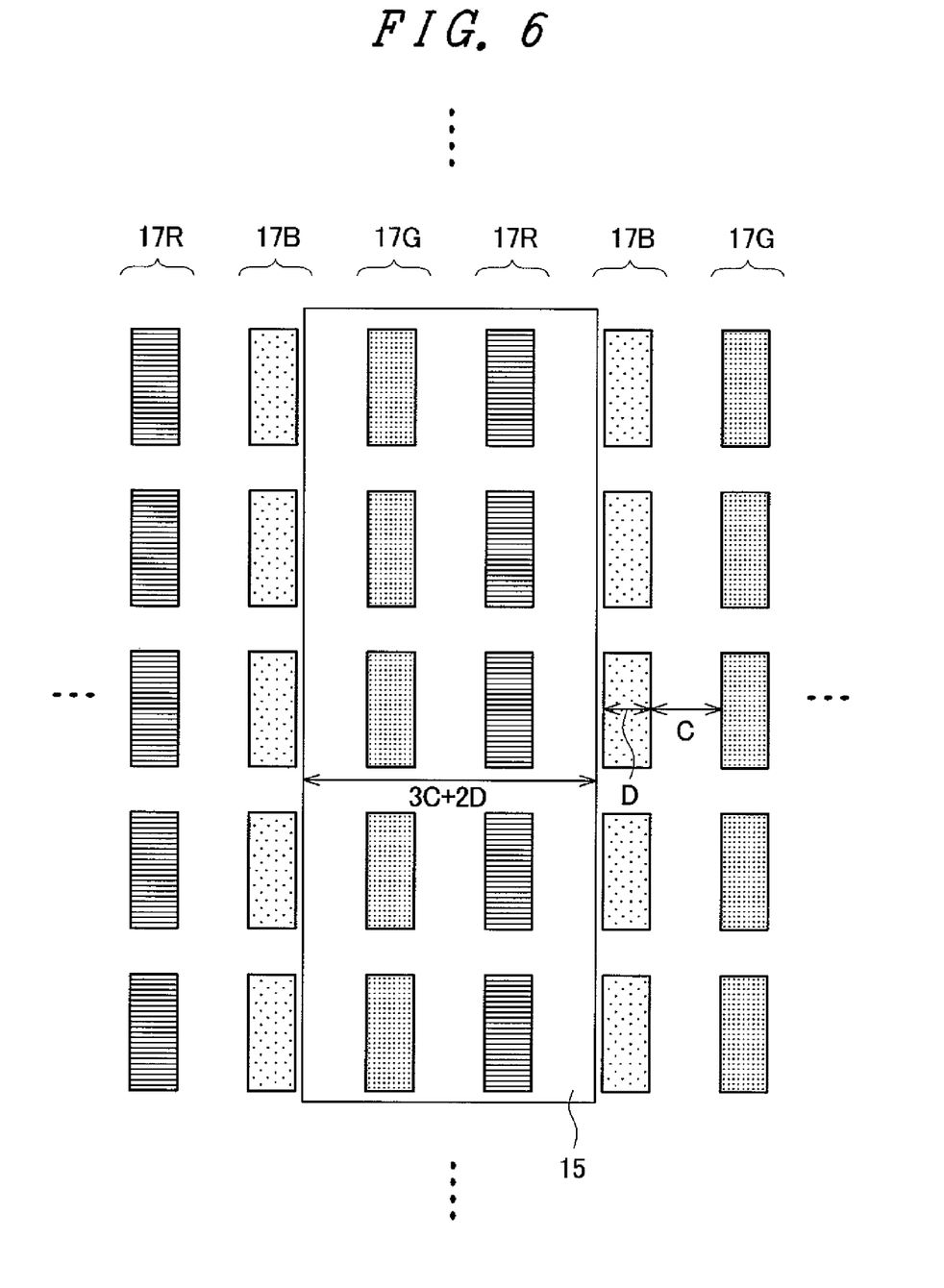
FIG. 6 is a plan view of the first embodiment.

FIG. 6 is a plan view showing the embodiment. In FIG. 6, the red pixels 17R, the green pixels 17G, and the blue pixels 17B are respectively aligned in the vertical direction. Only the upper electrodes 15 for the green pixels 17G and the red pixels 17R are formed thicker. Needless to say, the upper electrodes 15 are formed in the blue pixels 17B but the thicknesses of the upper electrodes 15 for the blue pixels 17B are thinner than those of the red pixels 17R and the green pixels 17G.

These upper electrodes 15 can be formed as follows. Namely, the upper electrodes 15 are first formed on the whole surface through sputtering in the same film thicknesses as those of the upper electrodes 15 for the blue pixels 17B. Then, using a mask, the upper electrodes 15 for the green pixels 17G and the red pixels 17R are further formed up to necessary thicknesses through sputtering. In this case, the above deposition is preferably performed through the sputtering of high orientation like ion beam sputtering.

The width of an opening of the mask for sputtering in this embodiment is 3C+2D and relatively large, as illustrated in FIG. 6. Here, the reference symbol C indicates the width of the bank 13 and the reference symbol D indicates the width of a pixel. When the auxiliary electrodes 16 are formed, as shown in FIG. 8, the width of the opening of the mask is C. Therefore, the opening of the mask for the sputtering in this embodiment is much larger than in the case of forming the auxiliary electrodes 16 and the embodiment can cope with the pixel arrangement of high definition sufficiently.

Through the additional sputtering to the red pixels 17R and the green pixels 17G, the transparent electrodes are deposited there, in this embodiment, and therefore, even when sputtering accuracy is bad and InZnO used for the sputtering runs into one portion of the blue pixels 17B, there is no significant effect on brightness.

As mentioned above, according to the embodiment, it is possible to reduce the shading without actually deteriorating the brightness.

Embodiment 2

The first embodiment reduces the shading by enlarging the respective film thicknesses of the respective upper electrodes 15 for the red pixel 17R and the green pixel 17G without enlarging the film thickness of the upper electrodes 15 for the blue pixel 17B. In the first embodiment, the film thickness for the red pixel 17R is equal to the film thickness for the green pixel 17G. The first embodiment has an advantage that only one additional sputtering can reduce the shading without actual deterioration in brightness because the film thickness for the red pixel 17R is equal to that for the green pixel 17G.

On the other hand, as illustrated in FIG. 4, the transmittance of the upper electrode 15 is greater in the short wavelength region. Therefore, from the view point of properties, it is the most rational to make the upper electrode 15 for the red pixel 17R thicker than the upper electrode 15 for the green pixel 17G. Also in this case, since the upper electrode 15 is not thickened in the blue pixel 17B, the blue pixel 17B gets the thinnest similarly.

Figure 10:
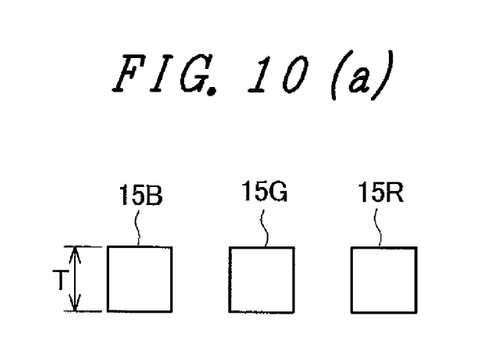
FIG. 10A and FIG. 10B are views for use in describing the setting of a film thickness of the upper electrode according to a second embodiment.

In this case, a film thickness of the upper electrode 15 in the respective pixels can be determined according to the concept as shown in FIG. 10A and FIG. 10B. In FIG. 10A and FIG. 10B, the respective reference symbols 15B, 15G, and 15R indicate the respective upper electrodes 15 in the blue pixel 17B, the green pixel 17G, and the red pixel 17R. In FIG. 10A, the film thickness T means a film thickness when the shading is reduced to 10% or less in a screen by thickening the upper electrodes 15 of all the pixels. In FIG. 10B, the reference symbol TB indicates the film thickness of the upper electrode 15 for the blue pixel 17B whose film thickness is not enlarged, the reference symbol TTG indicates the film thickness of the upper electrode 15 for the green pixel 17G, and the reference symbol TTR indicates the film thickness of the upper electrode 15 for the red pixel 17R. In FIG. 10A and FIG. 10B, it satisfies the following relation: $3T \leq TTG+TTR+TB$. Namely, the whole volume of the upper electrodes 15 in the case where only the upper electrode 15 for the blue pixel 17B is not thickened, is equal to or larger than that in the case where the upper electrodes for all the pixels are uniformly formed in the same thickness. According to this, a voltage drop in the upper electrodes 15 in the case of FIG. 10B can be set equal to or less than a voltage drop in the upper electrodes 15 in the case of FIG. 10A. This concept is the same as in the first embodiment.

In this embodiment, at first, InZnO is deposited on the whole surface through sputtering with the same thickness as that of the upper electrode 15 for the blue pixel 17B. Then, using the same mask as having been used in the first embodiment, InZnO is deposited on the green pixels 17G and the red pixels 17R through sputtering, and thereafter, using the mask, InZnO is deposited only on the red pixels 17R through sputtering.

According to this embodiment, it is possible to suppress the shading as well as the deterioration in brightness.

Embodiment 3

This embodiment relates to the case where the film thickness of the upper electrode 15 is enlarged either in the red pixel 17R or the green pixel 17G. When the film thickness of the upper electrode 15 changes, the light interference effect varies. The most suitable film thickness for taking out light depends on light wavelength. Therefore, when the film thicknesses of the upper electrodes 15 are enlarged in all the pixels including the red pixel 17R, the green pixel 17G, and the blue pixel 17B, the interference effect varies depending on the color.

As having been described in the first embodiment, when the film thickness of the upper electrode 15 for the blue pixel 17B is also enlarged, the brightness deteriorates. Further, like the second embodiment, when the film thicknesses for the red pixel 17R and the green pixel 17G are varied from each other, additional sputtering has to be performed two times. In this embodiment, additional sputtering is reduced to one time and the red pixel 17R or the green pixel 17G is selected to enlarge the film thickness of the upper electrode 15, taking the light interference effect into consideration.

Figure 11:
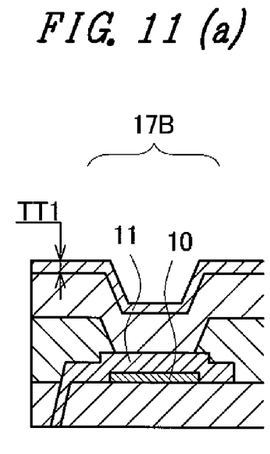
FIG. 11A, FIG. 11B, and FIG. 11C are cross sectional views according to a third embodiment.

FIG. 11A, FIG. 11B, and FIG. 11C are cross sectional views showing an example in the case of enlarging the film thickness of the upper electrode 15 only in the red pixel 17R. FIG. 11A is a cross sectional view of the blue pixel 17B, where the film thickness of the upper electrode 15 is TT1. FIG. 11B is a cross sectional view of the green pixel 17G, where the film thickness of the upper electrode 15 is TT1. FIG. 11C is a cross sectional view of the red pigment 17R, where the film thickness of the upper electrode 15 is TT2. Only the film thickness of the upper electrode 15 in the red pixel 17R gets thicker.

The condition that the shading is reduced to 10% or less in a screen by thickening the film thicknesses of the upper electrodes 15 in either the red pixels 17R or the green pixels 17G, in FIG. 11A, FIG. 11B, and FIG. 11C, is as follows: 3T−2TT1≦TT2.

Figure 12:
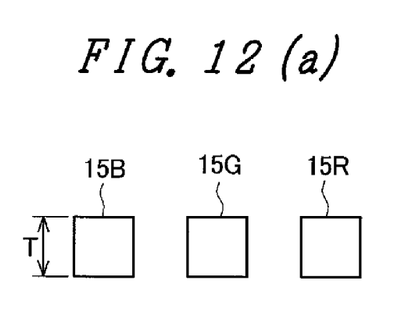
FIG. 12A and FIG. 12B are views for use in describing the setting of a film thickness of the upper electrode according to the third embodiment.

The above expression can be derived from the concept as shown in FIG. 12A and FIG. 12B.

In FIG. 12A and FIG. 12B, the respective reference symbols 15B, 15G, and 15R indicate the respective upper electrodes 15 in the blue pixel 17B, the green pixel 17G, and the red pixel 17R. In FIG. 12A, the film thickness T indicates a film thickness when the shading is reduced to 10% or less in a screen by thickening the upper electrodes 15 in all the pixels. In FIG. 12B, the reference symbol TT1 indicates the respective film thicknesses for the blue pixel 17B and the green pixel 17G which are not enlarged in film thicknesses, and the reference symbol TT2 indicates the film thickness of the upper electrode 15 for the red pixel 17R.

In FIG. 12A and FIG. 12B, it satisfies the following relation: 3T≦TT2+2TT1. Namely, the whole volume of the upper electrodes 15 in the case of enlarging the upper electrodes 15 only for the red pixels 17R is equal to or larger than that in the case of making all the pixels uniformly thick. According to this, a voltage drop in the upper electrodes 15 in the case of FIG. 12B can be set equal to or less than a voltage drop in the upper electrodes 15 in the case of FIG. 12A.

When the upper electrode 15 in the red pixel 17R gets thicker in this way, it is necessary to avoid such a film thickness that red light is difficult to go outside by interference. This condition is given by the following expression (1).

[Expression 1] (1)

$$\left( n(\lambda_{max}) \times d + \sum_{i=1}^{j} \{n_i(\lambda_{max}) \times d_i\} \right) - \left( \frac{1}{4} + \frac{m}{2} \right) \times \lambda_{max} \leq \frac{\lambda_{max}}{32}$$

$$(m = 1, 2, 3, \ldots)$$

In the expression (1), the symbol $\lambda_{max}$ indicates a peak wavelength of the emission spectrum in the red pixel 17R, $n(\lambda_{max})$ indicates a refractive index of the upper electrode 15 in $\lambda_{max}$, and the symbol d indicates a film thickness of the transparent electrode. In each pixel, there are not only the upper electrode 15 but also the emitting layer and the lower electrode 11. These films affect light interference. The symbol $n_i(\lambda_{max})$ indicates the refractive index in $\lambda_{max}$ in one of these films. The symbol $d_i$ indicates the film thickness of one of these layers.

Figure 13:
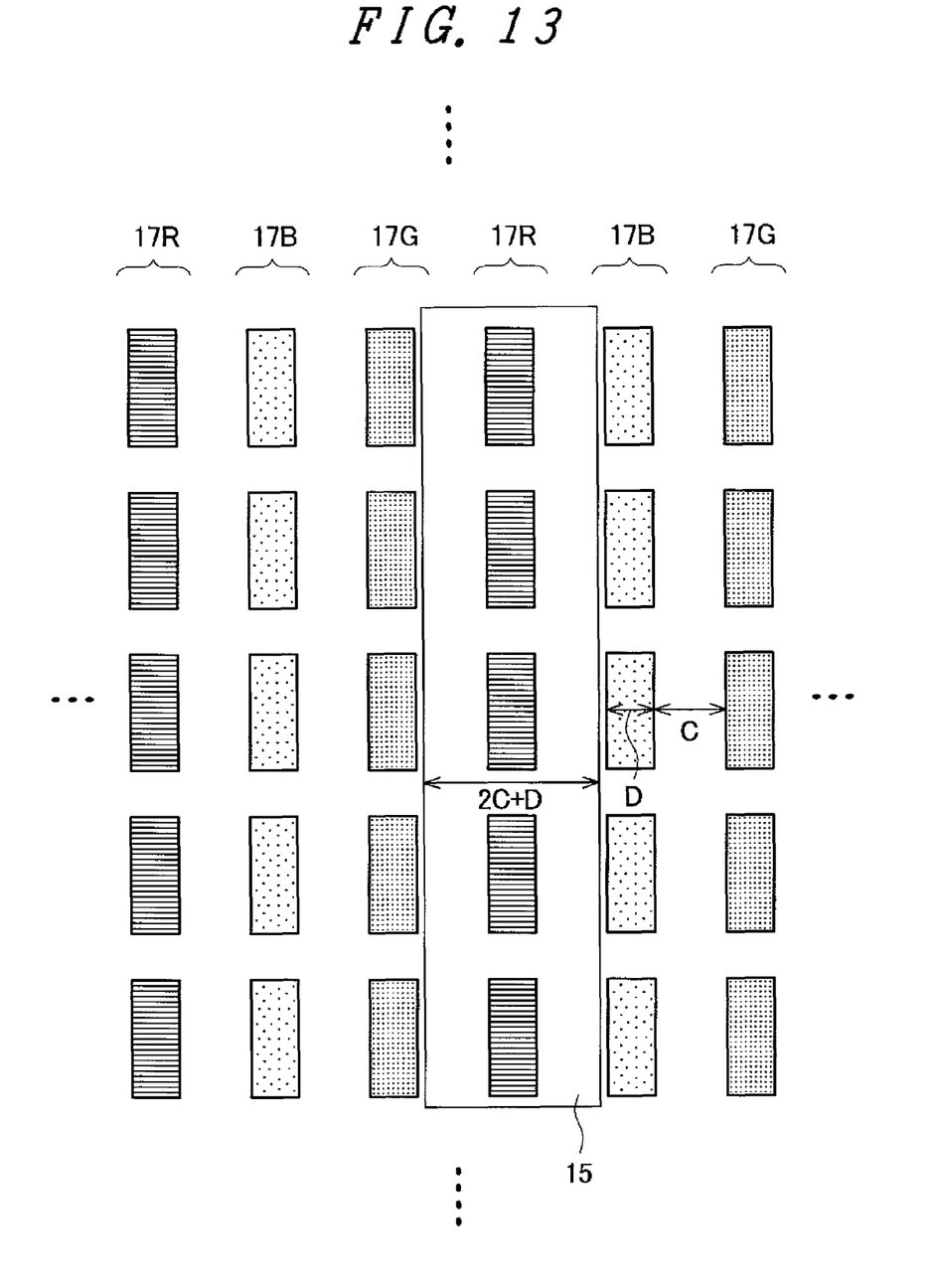
FIG. 13 is a plan view of the third embodiment.

Plan view of FIG. 11A, FIG. 11B, and FIG. 11C is shown in FIG. 13. In FIG. 13, the red pixels 17R, the blue pixels 17B, and the green pixels 17G are respectively arranged in portrait orientation. The upper electrodes 15 are formed on the whole surface through sputtering. A second layer of the upper electrodes 15 is formed on the red pixels 17R through sputtering, in addition to the upper electrodes 15 formed on the whole surface. The width of the second layered sputtering formed on the red pixels 17R is 2C+D. This width is narrower than the width of 3C+2D in the first embodiment; however, it is much larger than the width C of the auxiliary electrodes 16. Therefore, it can fully cope with a high definition screen.

Figure 14:
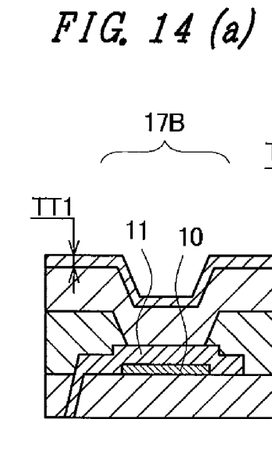
FIG. 14A, FIG. 14B, and FIG. 14C are the other cross sectional views according to the third embodiment.

FIG. 14A, FIG. 14B, and FIG. 14C are cross sectional views showing an example in the case of enlarging the film thickness of the upper electrode 15 only in the green pixel 17G. FIG. 14A is a cross sectional view of the blue pixel 17B, where the film thickness of the upper electrode 15 is TT1. FIG. 14B is a cross sectional view of the green pixel 17C, where the film thickness of the upper electrode 15 is TT2. FIG. 14C is a cross sectional view of the red pixel 17R, where the film thickness of the upper electrode 15 is TT1. Only the film thickness of the upper electrode 15 for the green pixel 17G gets thicker.

The way of setting a film thickness of the upper electrode 15 in the respective pixels in FIG. 14A, FIG. 14B, and FIG. 14C is the same as the way having been described in FIG. 12A and FIG. 12B. The relationship between the red pixel 17R and the green pixel 17G in FIG. 12A and FIG. 12B is just switched. Further, the way of setting the film thickness of the upper electrode 15 for the green pixel 17G with interference effect into consideration, is the same as the way having been described in the expression (1). The $\lambda_{max}$ in the expression (1) becomes a peak wavelength of the emission spectrum in the green pixel 17G.

Figure 15:
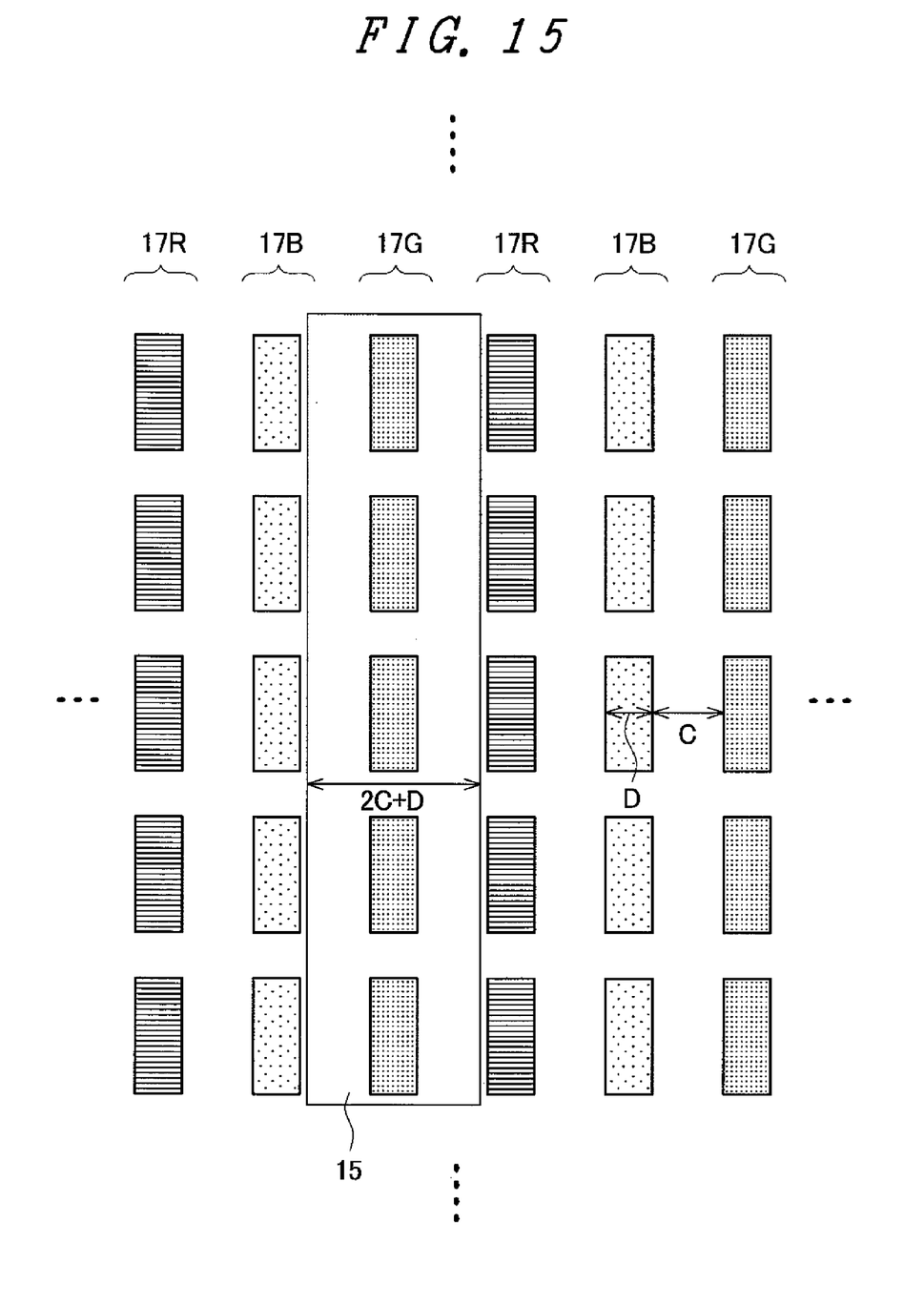
FIG. 15 is the other plan view according to the third embodiment.

Plan view of pixel arrangement corresponding to FIG. 14A, FIG. 14B, and FIG. 14C is shown in FIG. 15. In FIG. 15, the red pixels 17R, the blue pixels 17B, and the green pixels 17G are respectively arranged in portrait orientation. In FIG. 15, the upper electrodes 15 are formed on the whole surface through sputtering. A second layer of the upper electrodes 15 is deposited on the green pixels 17G, in addition to the upper electrodes 15 formed on the whole surface. The width of the second layered sputtering formed on the green pixels 17G is 2C+D. This width is narrower than the width of 3C+2D in the first embodiment; however, it is much larger than the width C of the auxiliary electrode 16. Therefore, it can fully cope with a high definition screen.

As mentioned above, according to the embodiment, it is possible to suppress the shading as well as the substantial deterioration in screen brightness. Further, it can effectively avoid the deterioration in the efficiency of taking out light owing to the interference effect of light, and therefore, an organic EL display device of bright screen can be realized.

What is claimed is:

1. A top emission type organic EL display device with a screen comprising a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, wherein
when total sum of current applied to the plurality of red pixels is 50 mA, total sum of current applied to the plurality of green pixels is 50 mA, and total sum of current applied to the plurality of blue pixels is 50 mA, brightness gradient is 10% or less in the screen, a film thickness of the upper electrode for the red pixel is equal to a film thickness of the upper electrode for the green pixel, and a film thickness of the upper electrode for the blue pixel is smaller than the film thicknesses of the upper electrodes for the red pixel and the green pixel.

2. The organic EL display device according to claim 1, wherein
the film thickness of the upper electrode for the blue pixel is 1/10 or less of the film thickness of the upper electrode for the red pixel or the film thickness of the upper electrode for the green pixel.

3. A top emission type organic EL display device with a screen comprising a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, wherein
when total sum of current applied to the plurality of red pixels is 50 mA; total sum of current applied to the plurality of green pixels is 50 mA; total sum of current applied to the plurality of blue pixels is 50 mA; such a film thickness of the upper electrode that brightness gradient is reduced to 10% or less in the screen, with the upper electrodes for the red pixel, the green pixel, and the blue pixel formed in the same thicknesses, is defined as T;
the film thickness of the upper electrode for the blue pixel is defined as TB; the film thickness of the upper electrode for the red pixel is defined as TR; and the film thickness of the upper electrode for the green pixel is defined as TG,
TR is equal to TG, and TR and TG are respectively equal to or larger than 3T/2−TB/3.

4. The organic EL display device according to claim 3, wherein
when the film thickness of the upper electrode for the blue pixel is defined as TB, the film thickness of the upper electrode for the red pixel is defined as TR, and the film thickness of the upper electrode for the green pixel is defined as TG, TR and TG are respectively more than 10 times larger than TB.

5. A top emission type organic EL display device with a screen comprising a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, wherein
when total sum of current applied to the plurality of red pixels is 50 mA; total sum of current applied to the plurality of green pixels is 50 mA; total sum of current applied to the plurality of blue pixels is 50 mA; such a film thickness of the upper electrode that brightness gradient is reduced to 10% or less in the screen, with the upper electrodes for the red pixel, the green pixel, and the blue pixel formed in the same thicknesses, is defined as T;
the film thickness of the upper electrode for the blue pixel is defined as TB; the film thickness of the upper electrode for the red pixel is defined as TR; and the film thickness of the upper electrode for the green pixel is defined as TG,
the following expressions are satisfied: TB<TG<TR and 3T≦TG+TR+TB.

6. A top emission type organic EL display device with a screen comprising a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, wherein
when total sum of current applied to the plurality of red pixels is 50 mA; total sum of current applied to the plurality of green pixels is 50 mA; total sum of current applied to the plurality of blue pixels is 50 mA; such a film thickness of the upper electrode that brightness gradient is reduced to 10% or less in the screen, with the upper electrodes for the red pixel, the green pixel, and the blue pixel formed in the same thicknesses, is defined as T;
the film thickness of the upper electrode for the blue pixel is defined as TB; the film thickness of the upper electrode for the red pixel is defined as TR; and the film thickness of the upper electrode for the green pixel is defined as TG,
when TB=TG<TR and TB=TG=TT1,
3T−2TT1≦TR, and
in the red pixel, the following expression 1 is satisfied:

[Expression 1] (1)

$$\left( n(\lambda_{max}) \times d + \sum_{i=1}^{j} \{ n_i(\lambda_{max}) \times d_i \} \right) - \left( \frac{1}{4} + \frac{m}{2} \right) \times \lambda_{max} \leq \frac{\lambda_{max}}{32}$$

$$(m = 1, 2, 3, \dots )$$

where, $\lambda_{max}$ indicates a peak wavelength of emission spectrum in the red pixel, $n(\lambda_{max})$ indicates a refractive index of the upper electrode in $\lambda_{max}$, d indicates a film thickness of the upper electrode, $d_i$ indicates a film thickness of the organic EL layer or the lower electrode, and $n_i(\lambda_{max})$ indicates a refractive index in $\lambda_{max}$ of the organic EL layer or the lower electrode.

7. A top emission type organic EL display device with a screen comprising a plurality of red pixels having an organic EL layer for emitting red color which is sandwiched between an upper electrode and a lower electrode, a plurality of green pixels having an organic EL layer for emitting green color which is sandwiched between an upper electrode and a lower electrode, and a plurality of blue pixels having an organic EL layer for emitting blue color which is sandwiched between an upper electrode and a lower electrode, wherein
when total sum of current applied to the plurality of red pixels is 50 mA; total sum of current applied to the plurality of green pixels is 50 mA; total sum of current applied to the plurality of blue pixels is 50 mA; such a film thickness of the upper electrode that brightness gradient is reduced to 10% or less in the screen, with the upper electrodes for the red pixel, the green pixel, and the blue pixel formed in the same thicknesses, is defined as T;

the film thickness of the upper electrode for the blue pixel is defined as TB; the film thickness of the upper electrode for the red pixel is defined as TR; and the film thickness of the upper electrode for the green pixel is defined as TG, when TB=TR<TG and TB=TR=TT1,

3T−2TT1≦TG, in the green pixel, the following expression 1 is satisfied:

[Expression 2]

$$\left(n(\lambda_{max}) \times d + \sum_{i=1}^{j} \{n_i(\lambda_{max}) \times d_i\}\right) - \left(\frac{1}{4} + \frac{m}{2}\right) \times \lambda_{max} \leq \frac{\lambda_{max}}{32} \quad (1)$$

$$(m = 1, 2, 3, \dots )$$

where, λmax indicates a peak wavelength of emission spectrum in the red pixel, n(λmax) indicates a refractive index of the upper electrode in λmax, d indicates a film thickness of the upper electrode, di indicates a film thickness of the organic EL layer or the lower electrode, and ni(λmax) indicates a refractive index in λmax of the organic EL layer or the lower electrode.

8. The organic EL display device according to claim 1, wherein the upper electrode is formed of oxide containing In, Zn, or Sn as a chief ingredient.

9. The organic EL display device according to claim 1, wherein the upper electrode is formed of InZnO.

\* \* \* \* \*